United States Patent
Kim et al.

(10) Patent No.: US 7,518,704 B2
(45) Date of Patent: Apr. 14, 2009

(54) MULTIPLE EXPOSURE APPARATUS AND MULTIPLE EXPOSURE METHOD USING THE SAME

(75) Inventors: Sang-jin Kim, Suwon-si (KR); Gi-sung Yeo, Seoul (KR); Joon-soo Park, Seongnam-si (KR); Byeong-soo Kim, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 441 days.

(21) Appl. No.: 11/331,006

(22) Filed: Jan. 13, 2006

(65) Prior Publication Data
US 2006/0192933 A1    Aug. 31, 2006

(30) Foreign Application Priority Data
Feb. 26, 2005    (KR) ............... 10-2005-0016265

(51) Int. Cl.
*G03B 27/54* (2006.01)
*G03B 27/42* (2006.01)
(52) U.S. Cl. .................................. 355/67; 355/53
(58) Field of Classification Search .............. 355/67, 355/53, 71; 716/21
See application file for complete search history.

(56) References Cited
U.S. PATENT DOCUMENTS
2005/0162627 A1* 7/2005 Finders et al. ............ 355/53
2005/0231802 A1* 10/2005 Yokoyama et al. .......... 359/500
2006/0150131 A1* 7/2006 Lai et al. ................... 716/5

FOREIGN PATENT DOCUMENTS
| JP | 2000-012421 | | 1/2000 |
| KR | 100164076 B1 | | 9/1998 |
| KR | 1020030039449 | * | 5/2003 |
| KR | 1020030039449 A | | 5/2003 |

OTHER PUBLICATIONS

Sang Jin Kim, Method for forming storage node of capacitor, May 22, 2003, Machine Translation, Pertinent pp. 1-5.*

* cited by examiner

*Primary Examiner*—Alan A Mathews
*Assistant Examiner*—Danell L Owens
(74) *Attorney, Agent, or Firm*—Volentine & Whitt, PLLC

(57) ABSTRACT

A multiple exposure system and a multiple exposure method using the same enhance the resolution of the image of the mask pattern transferred to a substrate. The system includes NA controllers that provide excellent resolution with respect to the directions of the short axis and long axis of the mask pattern. In one form of the method, a first exposure process is performed using a first NA controller that provides excellent resolution with respect to the direction of the short axis of the mask pattern and subsequently, a second exposure process is performed using a second NA controller that provides excellent resolution with respect to the direction of the long axis of the mask pattern. Alternatively, the first exposure process and the second or high order exposure process can be sequentially performed using the first and second NA controllers simultaneously.

12 Claims, 9 Drawing Sheets

MULTIPLE EXPOSURE APPARATUS AND MULTIPLE EXPOSURE METHOD USING THE SAME

BACKGROUND OF THE INVENTION

1. Field of the Invention

The present invention relates to a method of and an apparatus for manufacturing semiconductor devices or LCDs. More particularly, the present invention relates to exposure apparatus of photolithographic equipment for transferring an image to a substrate, and to an exposure method using the same.

2. Description of the Related Art

A photolithography process is used in the manufacturing of semiconductor devices or LCDs to pattern a resist on a substrate. In the case of semiconductor devices, the substrate is a wafer on which a layer of the resist has been formed. In photolithography, a reticle bearing a mask pattern is illuminated with exposure light of a predetermined wavelength, and the resist is exposed to the light transmitted through the reticle. Accordingly, an image of the mask pattern can be transferred to the wafer. In addition, an exposure apparatus of the photolithography equipment includes a light emitting system for emitting the exposure light that illuminates the reticle, and an optical lens for reducing/projecting the image of the mask pattern of the reticle onto the wafer.

In the meantime, various efforts are being made to improve the resolution of the photolithography process to meet the demand for more highly integrated semiconductor devices. For example, systems and methods have been developed to control the numerical aperture (NA) of the light emitting system of the exposure apparatus.

FIGS. 1 through 3 illustrate a simulation of a photolithography process having a k1 factor of about 0.30, wherein $k1=(R \times NA)/\lambda$, R is the resolution, NA is the numeral aperture, and $\lambda$ is the wavelength of the exposure light. More specifically, FIG. 1 is a plan view of the reticle used in the simulated photolithography process, FIG. 2 is a plan view of an aperture plate used to control the NA, and FIG. 3 is a plan view of the pattern 22 transferred to a semiconductor substrate 20 by the photolithography process, i.e. represents the result of the simulation.

Referring to FIG. 1, the reticle 10 has a mask pattern 12 corresponding to the pattern to be transferred to the substrate. In the photolithography process, the mask pattern 12 may be oriented at an acute angle (as shown) with respect to the X-axis of the exposure apparatus or may be oriented parallel to or perpendicular to the X-axis. Also, the direction in which the features of the mask pattern 12 are spaced with the shortest pitch is referred to as the short axis of the mask pattern 12, and the direction in which the features of the mask pattern 12 are spaced with the longest pitch is referred to as the long axis of the mask pattern 12.

The aperture plate 15 has a dipole aperture as illustrated in FIG. 2 and is an NA controller having excellent resolving power with respect to the short axis of the mask pattern 12. However, the aperture plate 15 has low resolving power with respect to the long axis of the mask pattern 12.

Referring to FIG. 3, the pattern 22 transferred to the semiconductor substrate 20 shows that the dipole aperture has excellent resolving power with respect to the short axis direction. That is, the shape of the pattern 22 in the direction of the short axis of the mask pattern 12 can be clearly discriminated. On the contrary, the shape of the pattern 22 in the direction of the long axis of the mask pattern 12 can not be discriminated. That is, whereas features of the mask pattern 12 are spaced from one other along the short axis of the mask pattern 12, the corresponding features of the pattern 22 formed on the substrate 20 are contiguous in the direction of the long axis.

Finally, a double exposure process is one example of a conventional exposure process for controlling the NA. In the double exposure process, a region of a resist on a semiconductor substrate is exposed using a first reticle, and then the same region is subsequently exposed using a reticle having a mask pattern that is different from that of the first mask pattern. Therefore, the reticle is replaced during the double exposure process. Hence, the double exposure process imposes a limit on the throughput of the semiconductor device manufacturing process. Furthermore, the second reticle may not be exactly aligned with the pattern transferred to the resist during the first of the two exposure processes. In this case, a so-called shift of the pattern transferred to the resist occurs. As a result, the contrast of the pattern is poor.

SUMMARY OF THE INVENTION

An object of the present invention is to provide a multiple exposure apparatus and a multiple exposure method of using the same that provide excellent resolution in projecting an image of a mask pattern onto a substrate. That is, an object of the present invention is to provide a multiple exposure apparatus and method by which a pattern, formed by projecting an image of a mask pattern onto a substrate, can be discriminated with respect to both the direction of the short axis of the mask pattern and the direction of the long axis of the mask pattern.

Another object of the present invention is to provide a multiple exposure method which allows great flexibility in the forming of a pattern of a predetermined size so that problems associated with the optical proximity effect can be avoided, for example.

According to an aspect of the present invention, there is provided a multiple exposure apparatus including a light emitting system that emits exposure light, a reticle having a mask pattern, an NA (numerical aperture) control section disposed between the light system and the reticle with respect to an optical axis of the exposure apparatus, and a projection lens, wherein the NA control section includes a first NA controller that provides excellent resolution with respect to the direction of a short axis of the mask pattern, and a second NA controller that provides excellent resolution with respect to the direction of the long axis of the mask pattern. The reticle is disposed between the projection lens and the NA control section with respect to the optical axis such that the projection lens focuses onto an image plane an image of the mask pattern illuminated by the exposure light transmitted from the NA control section. The first NA controller may be an optical element (plate) having a dipole aperture, and the second NA controller may be an optical element (plate) having an annular aperture.

The features of the mask pattern of the reticle are spaced by a first pitch along the short axis, and by a second greater pitch along the long axis. Thus, at the very least, the first NA controller provides a resolution with respect to the direction of the short axis of the mask pattern that is higher than the resolution with respect to the direction of the long axis of the mask pattern. And, the second NA controller provides a resolution with respect to the direction of the long axis of the mask pattern that is higher than the resolution provided by the first NA controller with respect to the direction of the long axis of the mask pattern.

According to an other aspect of the present invention, there is provided a multiple exposure method comprising performing a first exposure process to transfer an image of a mask pattern of a reticle to a region of a resist on a substrate, and subsequently performing a second or higher order exposure processes to transfer an image of a mask pattern of a reticle to the same region of the resist, wherein at least one of the exposure processes comprises illuminating the mask pattern using the first NA controller to provide excellent resolution with respect to the direction of a short axis of the mask pattern, and at least one of the exposure processes comprises illuminating the mask pattern using the second NA controller to provide excellent resolution with respect to the direction of the long axis of the mask pattern.

The same reticle may be used in both the first exposure process and the second or higher order exposure process. On the other hand, the reticle may be replaced between the exposure processes. In this case, the shape of the mask pattern of the new reticle is the same as that of the mask pattern of the previous reticle.

According to yet another aspect of the present invention, the multiple exposure method may be carried out based on a correlation between the size of the pattern that will be formed on the substrate and certain process parameters or characteristics of the exposure apparatus. The size of the pattern can be characterized as the distance between adjacent ends of features that make up the pattern.

According to another aspect of the present invention, the first NA controller is exclusively used to perform a first exposure process and the second NA controller is exclusively used to perform a second or higher order exposure process. In this case, a ratio of the exposure latitudes is correlated with sizes of the patterns that can be formed on the substrate. Thus, a pattern having a predetermined size can be formed on the substrate. That is, conditions such as the exposure doses are selected so that the ratio of the exposure latitude of the first exposure process to the exposure latitude of the second or higher order exposure process has a certain value correlated to the desired size of the pattern to be formed. Alternatively, a ratio of numerical apertures is correlated with the sizes of the pattern that can be formed on the substrate so that a pattern having a predetermined size can be formed on the substrate. For instance, the NA controllers can be designed so that the ratio of the NA of the light emitting system to the NA of the projection lens has a certain value correlated to the desired size of the pattern to be formed. In addition, both the exposure latitudes and the numerical apertures can be correlated together with the sizes of the pattern that can be formed.

According to yet another aspect of the present invention, the first NA controller and the second NA controller are simultaneously used to perform both a first exposure process and a second or higher order exposure process. In this case, as well, conditions such as the exposure doses are selected so that the ratio of the exposure latitude of the first exposure process (using both of the NA controllers) to the exposure latitude of the second or higher order exposure process (also using both of the NA controllers) has a certain value correlated to the desired size of the pattern to be formed. Alternatively, a ratio of numerical apertures is correlated with the sizes of the pattern that can be formed on the substrate so that a pattern having a predetermined size can be formed on the substrate. Still further, both the exposure latitudes and the numerical apertures can be correlated together with the sizes of the pattern that can be formed.

BRIEF DESCRIPTION OF THE DRAWINGS

The above and other objects, features and advantages of the present invention will become more apparent from the following detailed description of the preferred embodiments thereof with reference to the attached drawings in which.

DETAILED DESCRIPTION OF THE PREFERRED EMBODIMENTS

Figure 1:
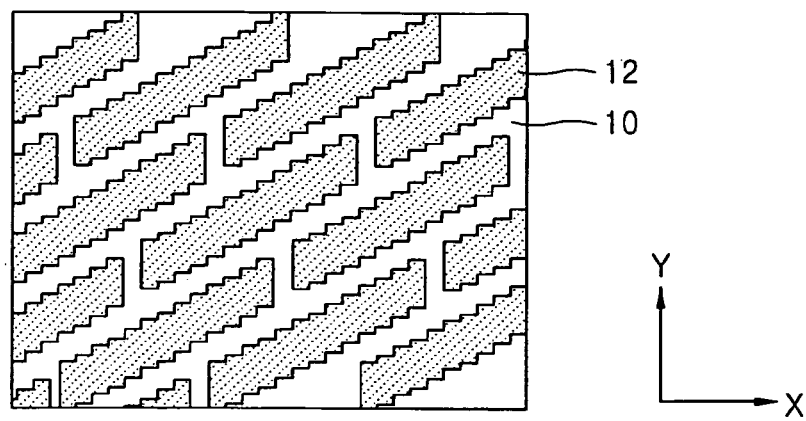
FIG. 1 is a plan view of a reticle having a mask pattern.
Figure 2:
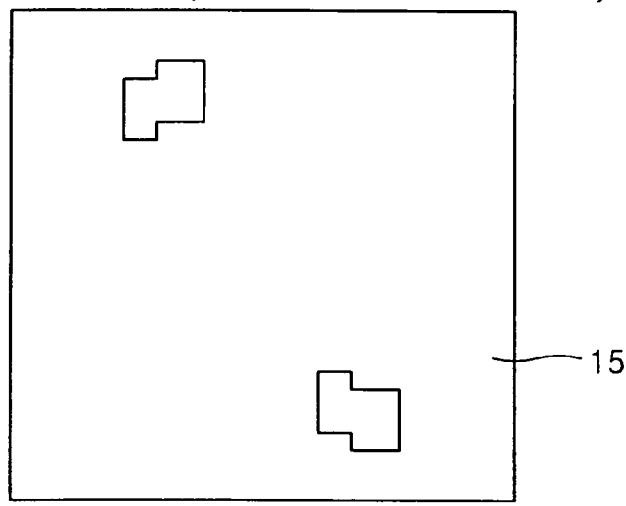
FIG. 2 is a plan view of an aperture plate having a dipole aperture as a conventional NA controller.
Figure 3:
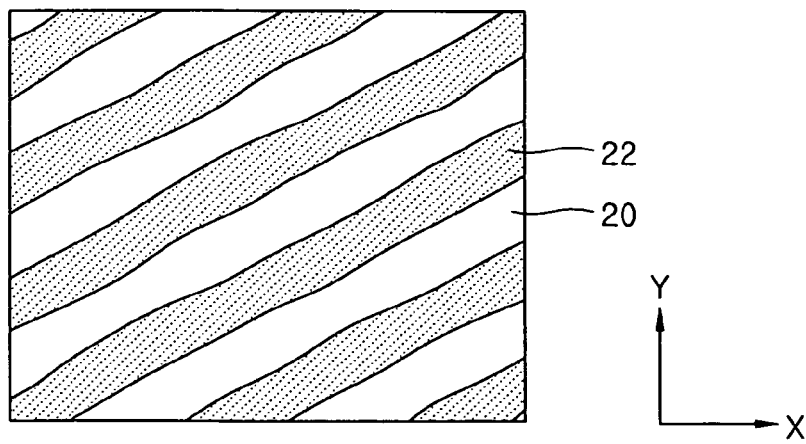
FIG. 3 is a plan view of a pattern formed on a substrate in a simulated photolithography process using the reticle of FIG. 1 and the aperture plate of FIG. 2.
Figure 4:
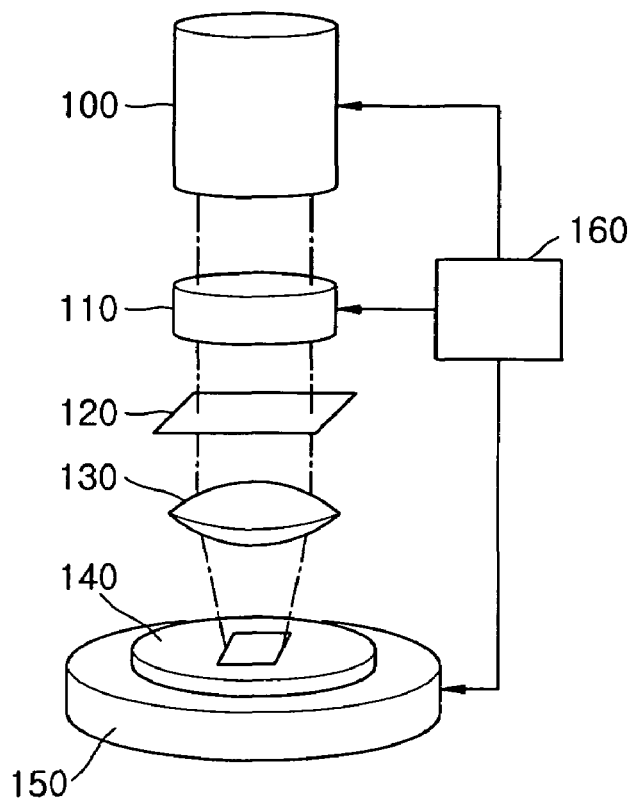
FIG. 4 is a schematic diagram of a multiple exposure apparatus of the present invention.

Referring first to FIG. 4, the exposure apparatus according to the present invention includes a light emitting system 100 having an ArF excimer laser as a light source, an NA control section 110 for controlling the NA of the light emitting system 100, a reticle 120 illuminated by light transmitted from the NA controller, a projection lens 130 that focuses the light that has passed through the reticle 120 toward a predetermined region on a wafer 140, and a wafer stage 150 for supporting the wafer 140.

The wafer 140 is a semiconductor substrate having a layer of resist on a surface thereof. The stage 150 is movable along X, Y, and Z axes as is conventional, per se, to position the wafer 140 relative to the projection lens 130. A controller 160 controls respective parts of the apparatus according to a sequence established by a program stored in the controller.

FIGS. 5 through 9 illustrate a simulation of a photolithography process using the multiple exposure apparatus of the present invention. The process has a k1 factor of about 0.30, wherein $k1=(R \times NA)/\lambda$, R is the resolution, NA is the numeral aperture, and $\lambda$ is the wavelength of the exposure light.

Figure 5:
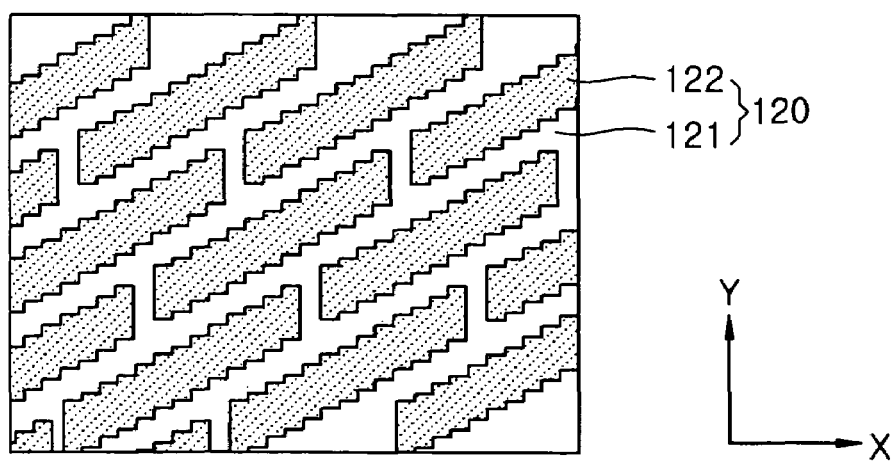
FIG. 5 is a plan view of a reticle for use in the multiple exposure apparatus according to the present invention.

Referring to FIG. 5, the reticle 120 includes a mask pattern 122 on a quartz substrate 121. The mask pattern 122 may be oriented at an angle with respect to the X-axis of the exposure apparatus (as shown) or may be oriented parallel to or perpendicular to the X-axis.

Figure 6:
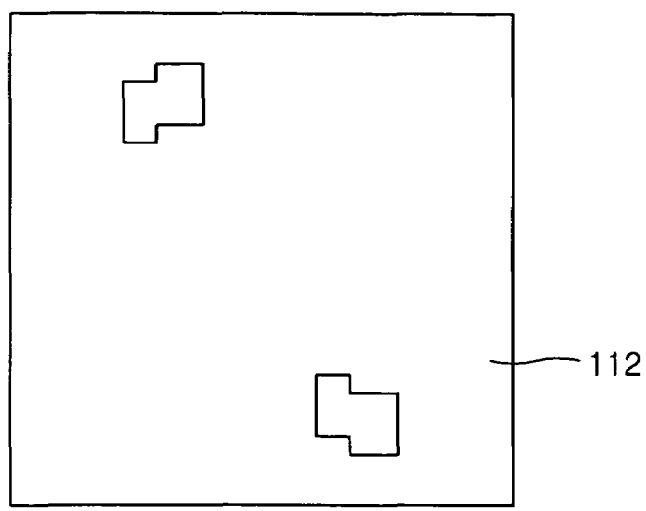
FIG. 6 is a plan view of a first NA controller of the multiple exposure apparatus according to the present invention.

Referring to FIG. 6, the first NA controller 112 provides excellent resolution with respect to the short axis of the mask pattern 122. For example, the first NA controller 112 is a plate having a dipole aperture. However, such a plate provides low resolution with respect to the long axis of the mask pattern 122.

Figure 7:
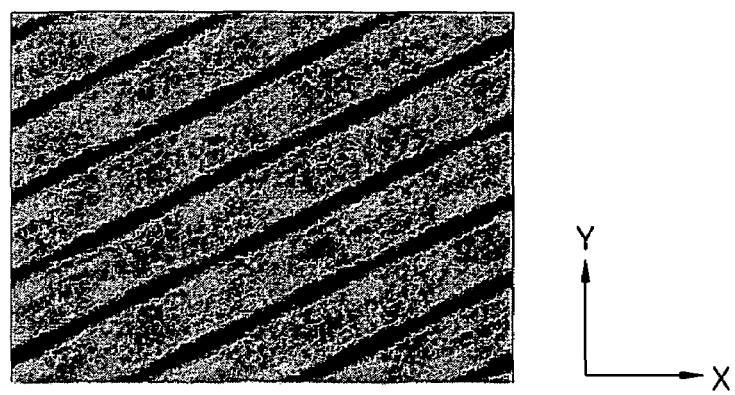
FIG. 7 is an aerial image of a pattern transferred when a first exposure process is performed using the reticle of FIG. 5 and the first NA controller.

Referring to FIG. 7, the image of the pattern transferred to the resist shows that the first NA controller 112 provides excellent resolution with respect to the short axis of the mask pattern 122. That is, the features of the pattern can be clearly discriminated in the direction of the short axis of the mask pattern 122. On the contrary, the features of the pattern can not be discriminated in the direction of the long axis of the mask pattern 122. That is, whereas features of the mask pattern 122 are spaced from one other along the short axis of the mask pattern 122, the corresponding features of the transmitted image of the pattern are contiguous in the direction of the long axis of the mask pattern 122.

Figure 8:
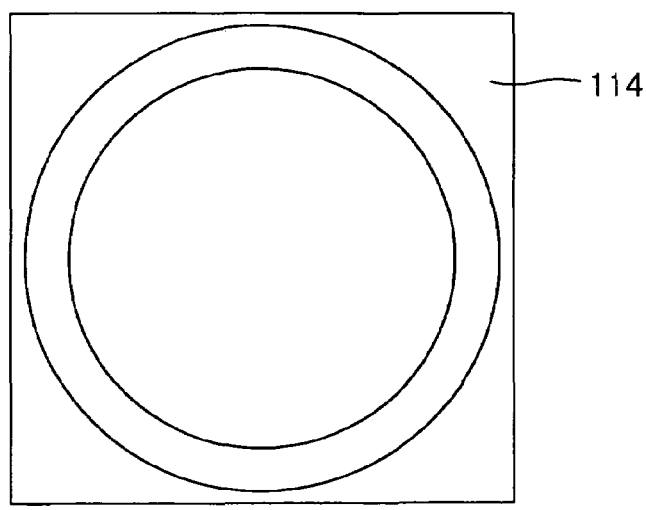
FIG. 8 is a plan view of a second NA controller of the multiple exposure apparatus according to the present invention.

Referring to FIG. 8, the second NA controller 114 provides excellent resolution with respect to the long axis of the mask pattern 122. For example, the second NA controller 114 is a plate having an annular aperture. The second NA controller 114 can be mounted to the same portion of the exposure apparatus from which the first NA controller 112 has been removed or can be mounted to a portion of the exposure apparatus located beneath that to which the first NA controller 112 is mounted.

Figure 9:
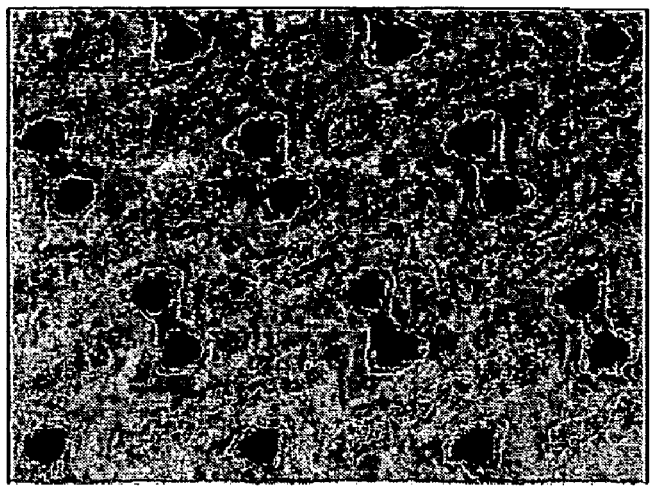
FIG. 9 is an aerial image of a pattern transferred when a second exposure process is performed using a reticle having the mask pattern of FIG. 5 and the second NA controller.
Figure 9:
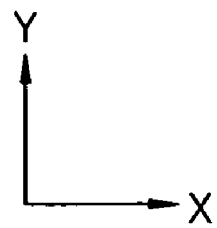

Referring to FIG. 9, the aerial image shows that the second NA controller 114 provides excellent resolution with respect to the long axis of the mask pattern 122. That is, the features of the image of the pattern can be clearly discriminated in the direction of the long axis of the mask pattern 122.

Figure 10:
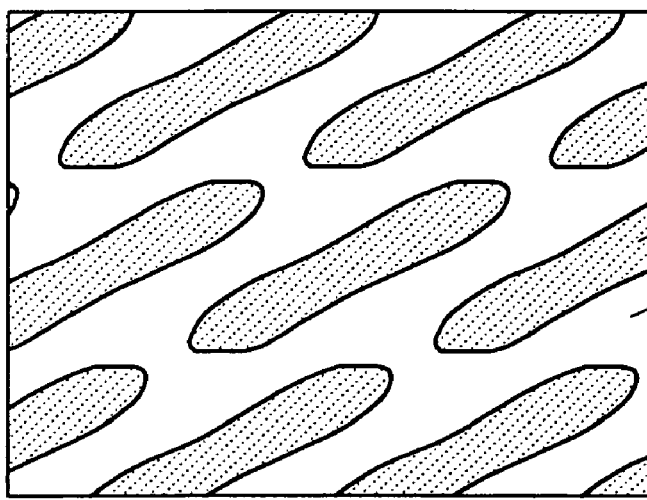
FIG. 10 is a plan view of the pattern formed on a substrate using the first and second NA controllers of the present invention.
Figure 10:
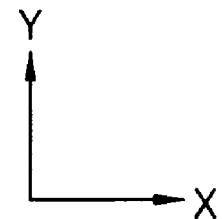
Figure 11:
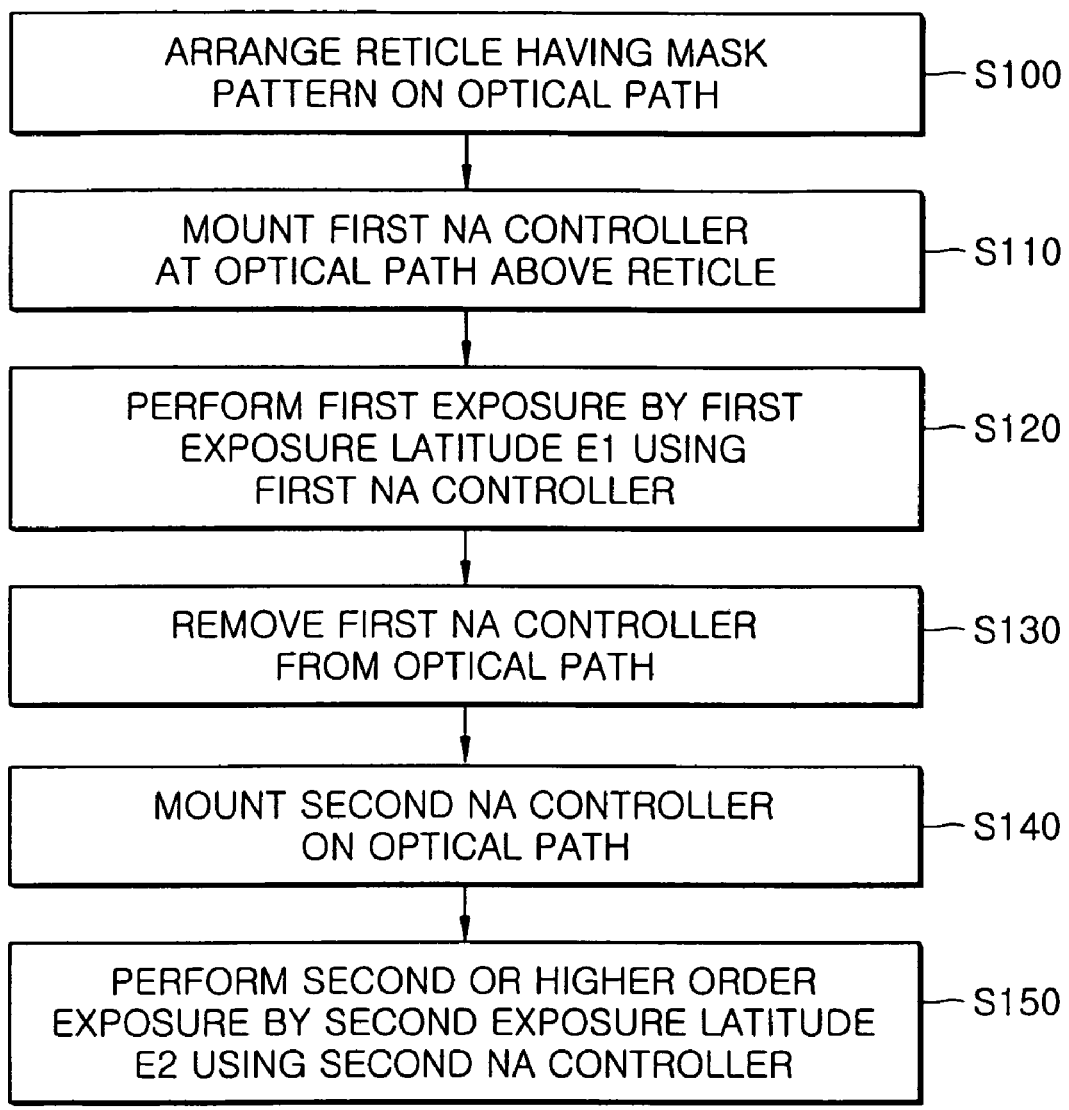
FIG. 11 is a flowchart of a multiple exposure method according to the present invention.

FIG. 10 shows the pattern 142 of the resist formed on substrate 141 using a double exposure method according to the present invention. In general, and referring back to FIG. 4, the method begins by placing the reticle 120 along the optical axis of the exposure apparatus. After that, the reticle 120 is illuminated with light emitted from the light emitting system 100 and passing through NA control section 110. The NA control section 110 includes a first NA controller 112 providing excellent resolution with respect to the direction of the short axis of the mask pattern 122 and a second NA controller 114 providing excellent resolution with respect to the direction of the long axis of the mask pattern 122. Accordingly, an image of the mask pattern 122 is transferred to the resist on wafer 140 seated on wafer stage 150 under the reticle 120. Then the resist is developed.

First Embodiment

In the first embodiment, the reticle 120 is positioned along an optical axis of the exposure apparatus, and the first NA controller 112 is disposed along the optical axis between the reticle 120 and the light source of the light emitting system 100. Subsequently, a region of the wafer 140 is exposed using the first NA controller 112. Then, the first NA controller 112 is moved off of the optical axis. Next, the second NA controller 114 is positioned along the optical axis between the reticle 120 and the light source of the light emitting system 100. Subsequently, a second or higher order exposure process is performed on the same region of the wafer but using the second NA controller 114. Here, the term "higher order exposure" process means an exposure process that has been repeated on the same region of the wafer using the same mask pattern and NA controller.

Second Embodiment

As an alternative, the reticle 120 is positioned along the optical path axis, and the first and second NA controllers 112 and 114 are simultaneously positioned along the optical axis between the reticle 120 and the light source of the light emitting system 100. Subsequently, a region of the wafer 140 is exposed using the first and second NA controllers 112 and 114. Next, a second or higher order exposure process is performed using the first and second NA controllers 112 and 114.

According to the present invention, a resist pattern 142 having excellent resolution in both the direction of the short axis and the direction of the long axis of the mask pattern 122 can be formed. That is, the features of the resist pattern 142, which are to correspond to those of the mask pattern 122, can be clearly discriminated in the directions of both the short and long axes of the mask pattern 122.

Controlling Size of the Pattern According to the First Embodiment

The size of the pattern 142 can be controlled by tailoring the exposure processes such that their exposure latitudes have a certain ratio, by setting up the exposure apparatus such that the NA of the projection lens 130 and the NA of the light emitting system 100 have certain values, or by both tailoring the exposure processes such that their exposure latitudes have a certain ratio and by setting up the exposure apparatus such that the NA of the projection lens 130 and the NA of the light emitting system 100 have certain values. According to the second embodiment of the present invention, the size of the pattern 142 can be controlled as a way to control the optical proximity effect.

<Dependence of Size of Pattern Formed on ratio E1/E2 of Exposure Latitudes>

Referring to FIGS. 4-11, the reticle 120 having the mask pattern 122 is positioned along an optical axis of the exposure apparatus (S100). Subsequently, the first NA controller 112 providing excellent resolution with respect to the short axis of the mask pattern 122 is positioned along the optical axis above the reticle 120, i.e., between the reticle and the light source of the light emitting system 100 with respect to the optical axis (S110). An image of the mask pattern 122 is transferred to a region (of the resist) on the wafer 140 in a first exposure process using the first NA controller 112 and in which the exposure latitude (first exposure latitude) is E1 (S120). Then, the first NA controller 112 is moved off of the optical axis (S130).

Next, the second NA controller 114 providing excellent resolution with respect to the long axis of the mask pattern 122 is mounted along the optical axis above the reticle 120, i.e., between the reticle and the light source of the light emitting system 100 with respect to the optical axis (S140). Subsequently, an image of the mask pattern 122 is transferred to the same region (of the resist) on the wafer 140 in a second or higher order exposure process using the second NA controller 114 and in which the exposure latitude (second exposure latitude) is E2 (S150). Thus, a pattern 142 can be formed on the wafer 140.

Figure 12A:
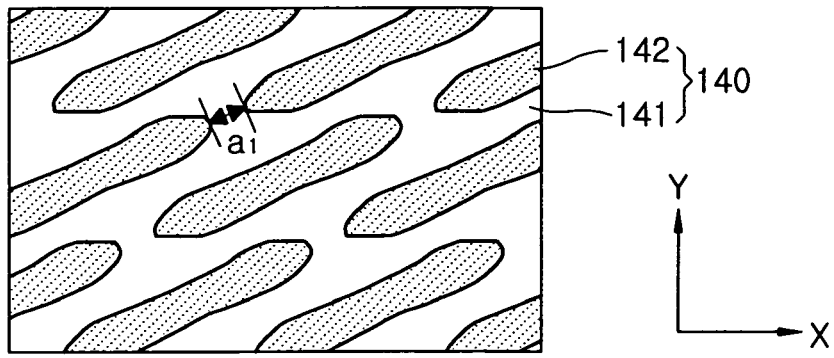
FIGS. 12A through 12C are plan views of patterns formed on substrates using multiple exposure methods in which exposure latitude ratios of E1/E2 differ, and together illustrate a correlation of exposure latitude ratio to size of pattern formed.
Figure 12B:
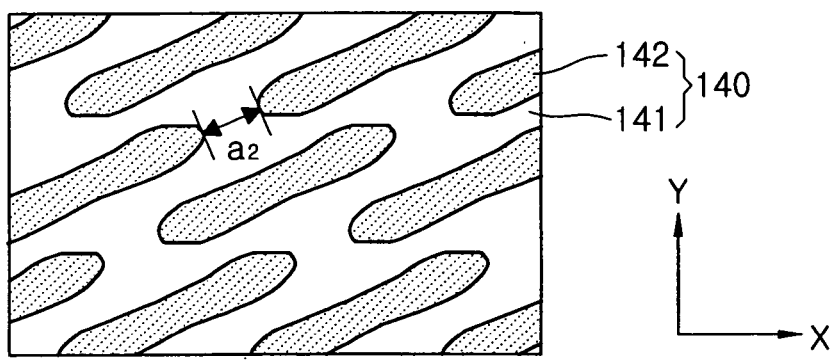
Figure 12C:
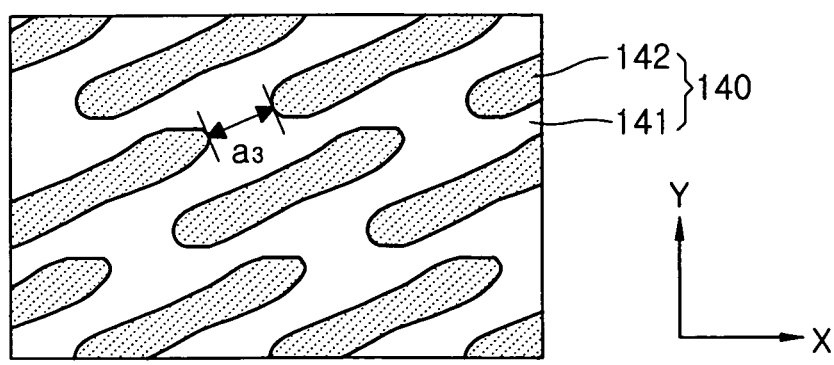

The size of the pattern 142 depends on the ratio E1/E2 of the exposure latitudes, as will now be clear from FIGS. 12A-12C. FIG. 12A illustrates the pattern 142 formed in the case in which the value of E1/E2 is 1, FIG. 12B illustrates the pattern 142 formed in the case in which the value of E1/E2 is 1.5, and FIG. 12C illustrates the pattern 142 formed in the case in which the value of E1/E2 is 2. That is, the value of E1/E2 in the case shown in FIG. 12C is large compared with the case shown in FIG. 12A.

Referring to FIGS. 12A through 12C, the distances between adjacent ends of the features of the pattern 142, as taken in the direction of the long axis of the mask pattern 122, are a1, a2, and a3 for the multiple exposure processes in which the values of E1/E2 are 1, 1.5, and 2, respectively. As also illustrated in FIGS. 12A through 12C, a1<a2<a3. Thus, a pattern 142 of a desired size can be created by carrying out exposure processes whose exposure latitudes E1, E2 have a certain ratio.

<Dependence of Size of Pattern Formed on NA Values of Exposure Apparatus>

Figure 13A:
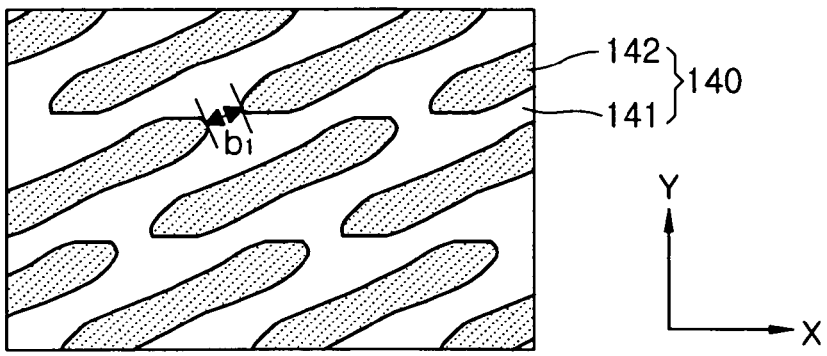
FIGS. 13A through 13C are plan views of patterns formed on substrates using exposure apparatuses in which the ratios of the NA of the projection lens/NA of the light emitting system differ, and together illustrate a correlation of NA ratio to size of pattern formed.
Figure 13B:
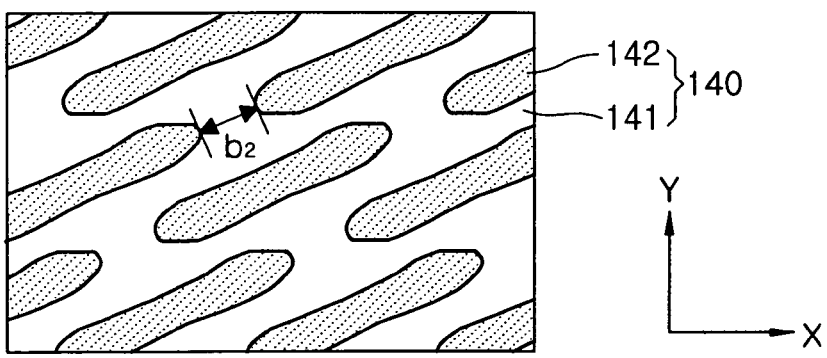
Figure 13C:
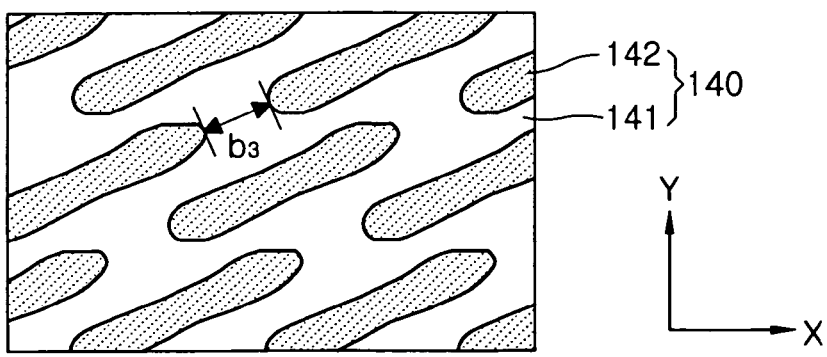

FIGS. 13A through 13C are plan views of patterns 142 formed by multiple exposure methods performed using exposure apparatus having different NA ratios, respectively. Here, the term NA ratio refers to the ratio of the NA of the projection lens 130 of the exposure apparatus to the NA of the light emitting system 100 of the exposure apparatus. FIG. 13A illustrates a pattern 142 formed in the case in which the NA ratio is 0.80/0.95, FIG. 13B illustrates a pattern 142 formed in the case in which the NA ratio is 0.75/0.95, and FIG. 13C illustrates a pattern 142 formed in the case in which the NA ratio is 0.70/0.95. That is, the NA ratio of the exposure apparatus used to form the pattern shown in FIG. 13C is small compared to the NA ratio of the exposure apparatus used to form the pattern shown in FIG. 13A.

Referring to FIGS. 13A through 13C, the distances between adjacent ends of the features of the pattern 142, as taken in the direction of the long axis of the mask pattern 122, are b1, b2, and b3 for the NA ratios of 0.80/0.95, 0.75/0.95, and 0.70/0.95, respectively. As is also illustrated in FIGS. 13A through 13C, b1<b2<b3. Thus, a pattern 142 of a desired size can be created by carrying out a multiple exposure method using an exposure apparatus having a certain NA ratio.

<Dependence of Size of Pattern Formed on Both the Ratio of Exposure Latitudes of the Exposure Processes and the NA Ratio of the Exposure Apparatus>

Although results of this technique are not shown, a pattern having a desired size can be formed on a substrate by performing a multiple exposure method in which the ratio of the exposure latitudes of the individual exposure processes has a certain value and the NA ratio of the exposure apparatus has a certain value.

[Controlling Size of the Pattern According to the Second Embodiment]

As was the case with the first embodiment, the size of the pattern 142 can be controlled by tailoring the first and second or higher order exposure processes such that their exposure latitudes have a certain ratio, by setting up the exposure apparatus such that the NA of the projection lens 130 and the NA of the light emitting system 100 have certain values, or by both tailoring the exposure processes such that their exposure latitudes have a certain ratio and by setting up the exposure apparatus such that the NA of the projection lens 130 and the NA of the light emitting system 100 have certain values.

<Dependence of Size of Pattern Formed on ratio E3/E4 of Exposure Latitudes>

Figure 14:
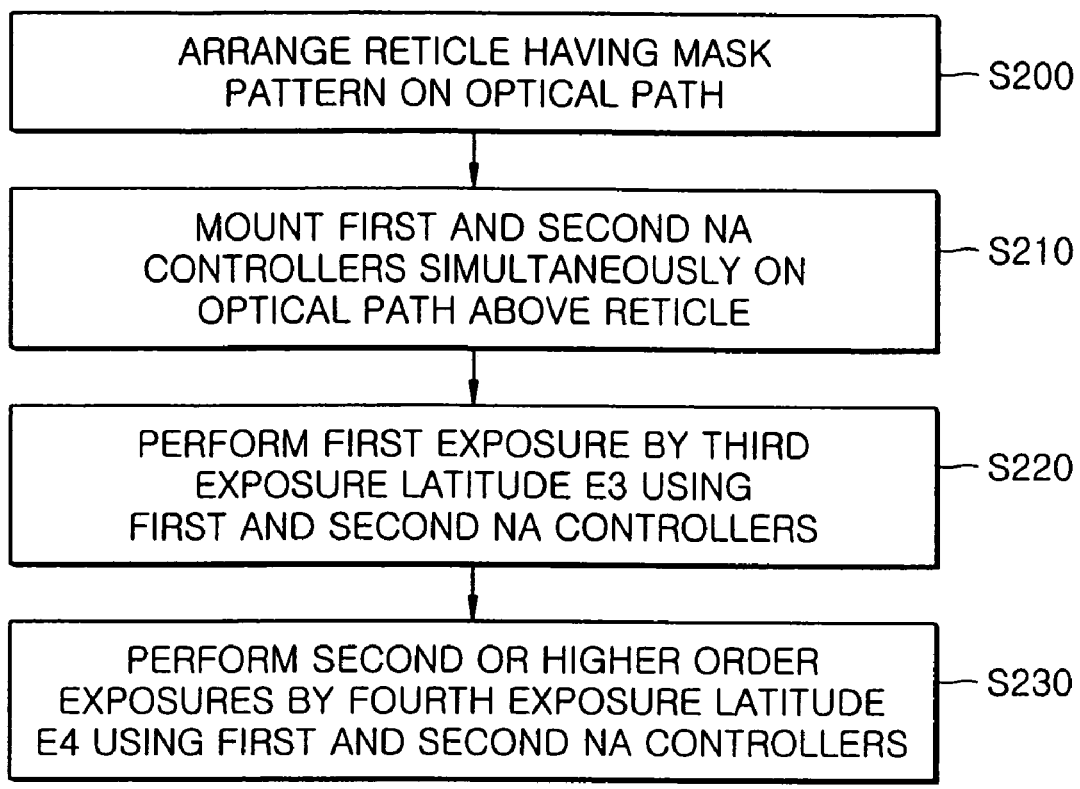
FIG. 14 is a flowchart of another multiple exposure method according to the present invention.

FIG. 14 is a flowchart illustrating the second embodiment of a multiple exposure process according to the present invention.

Referring to FIGS. 4-10 and 14, the reticle 120 having the mask pattern 122 is disposed along an optical path axis of the exposure apparatus (S200). Subsequently, the first NA controller 112 providing excellent resolution with respect to the direction of the short axis of the mask pattern 122 and the second NA controller 114 providing excellent resolution with respect to the direction of the long axis of the mask pattern 122 are both disposed along the optical axis above the reticle 120, i.e., between the reticle 120 and the light source of the light emitting system with respect to the optical axis (S210). An image of the mask pattern 122 is transferred to a region (of the resist) on wafer 140 by a first exposure process using the first and second NA controllers 112 and 114 and in which the exposure latitude is E3 (S220). Next, the image of the mask pattern 122 is transferred again to the same region (of the resist) on the wafer 140 by a second or higher order exposure process using the first and second NA controllers 112 and 114 and in which the exposure latitude is E4 (S230).

The size of the pattern 142 depends on the exposure latitude ratio of E3/E4. Thus, as was the case with the first embodiment, a pattern 142 of a desired size can be created by carrying out exposure processes whose exposure latitudes E3, E4 have certain values. Also, it is possible to control an optical proximity effect by forming the pattern 142 to a desired size according to the second embodiment of the present invention.

Still further, like the first embodiment, a pattern 142 having the desired size can be formed by setting up the exposure apparatus such that the NA of the projection lens 130 and the NA of the light emitting system 100 have certain values. Likewise, a pattern 142 having the desired size can be formed by tailoring the exposure processes such that their exposure latitudes E3, E4 have a certain ratio and by setting up the exposure apparatus such that the NA of the projection lens 130 and the NA of the light emitting system 100 have certain values.

Figure 15A:
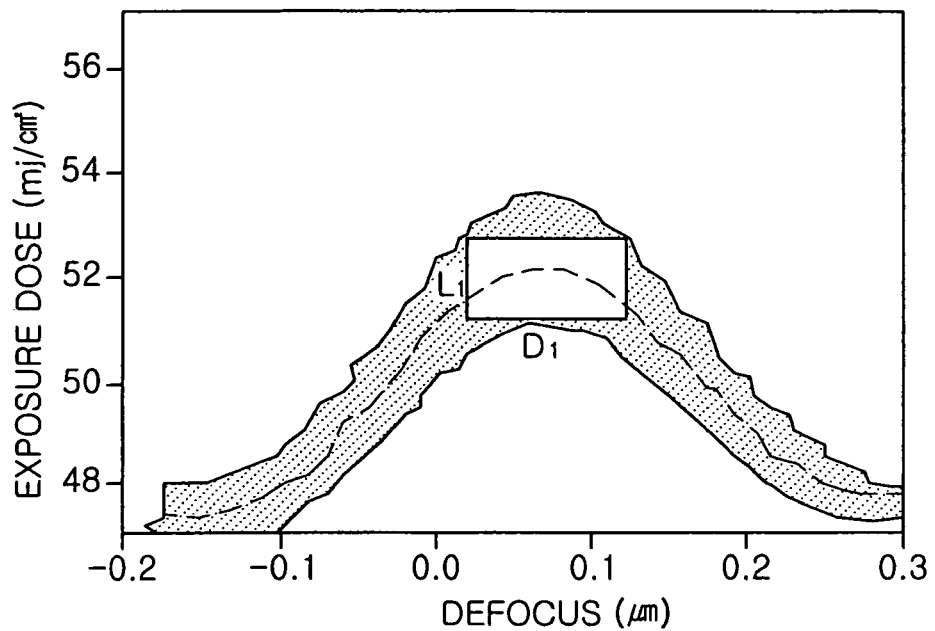
FIG. 15A is a graph illustrating the process window in the case of a conventional single exposure process.
Figure 15B:
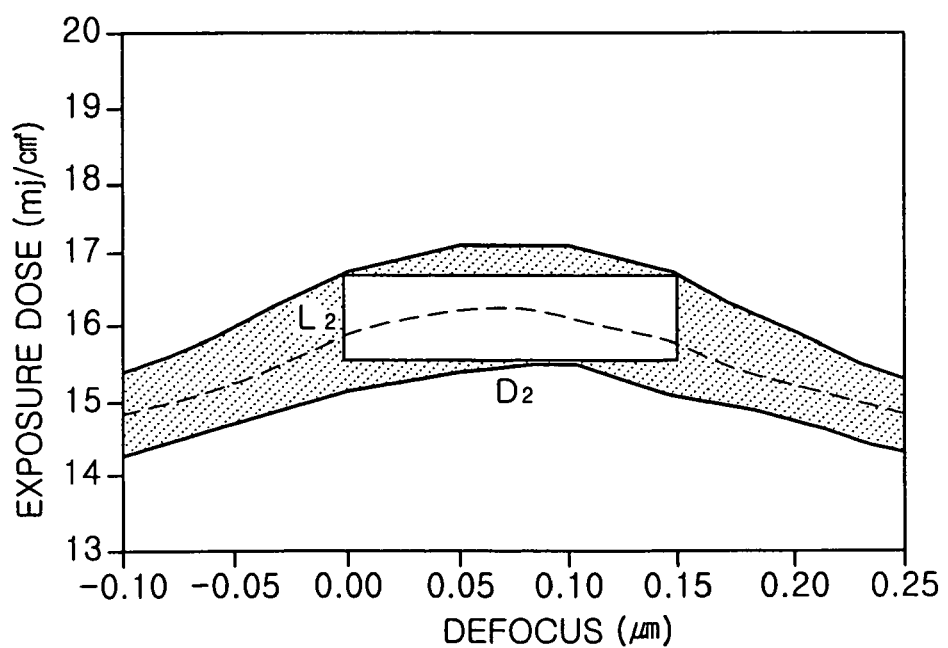
FIG. 15B is a graph showing the process window in the case of a multiple exposure process according to the present invention.

FIGS. 15A and 15B are graphs showing a comparison between the process window in the case of a conventional single exposure method and the process window in the case of a multiple exposure method according to the present invention. Referring to FIGS. 15A and 15B, the process window of the conventional single exposure method has an exposure latitude (L1) of about 3.2% and a depth of focus (D1) of 0.10 µm. On the contrary, the process window of the multiple exposure method according to the present invention has an exposure latitude (L2) of about 7.3% and a depth of focus (D2) of 0.15 µm. Therefore, the multiple exposure method of the present invention has a process window that is almost twice that of the process window of the conventional single exposure method. That is, the multiple exposure method according to the present invention has a better process margin for the overlaying of images. Therefore, the present invention can improve the overall productivity of the semiconductor device manufacturing process.

According to the present invention as described above, the resolution of the image of a mask pattern transferred to a substrate is enhanced by a first NA controller providing excellent resolution with respect to the direction of the short axis of the mask pattern and a second NA controller providing excellent resolution with respect to the direction of the long axis of the mask pattern. Also, it is possible to form a pattern on the substrate to a desired size by tailoring the exposure latitudes of the exposure processes and/or the ratio of the NA of the light emitting system to the NA of the projection lens. Therefore, limits imposed by the optical proximity effect can be overcome.

Finally, although the present invention has been particularly shown and described with reference to the preferred embodiments thereof, various changes in form and details may be made thereto without departing from true the spirit and scope of the present invention as defined by the following claims.

What is claimed is:

1. A multiple exposure apparatus comprising:
performing a first exposure process by exposing a region of a resist on a substrate to exposure light directed through a reticle;
subsequently performing a second or higher order exposure process comprising positioning a second NA controller along the optical axis, illuminating the mask pattern of a reticle with exposure light transmitted along the optical axis using the second NA controller, and exposing said region of the resist to the exposure light transmitted using the second NA controller and directed through the reticle,
wherein the reticle used in each of the exposure processes has a mask pattern of features spaced by a first pitch along a short axis, and by a second pitch along a long axis, wherein with the first pitch is shorter than the second pitch, and
wherein the first exposure process comprises illuminating the mask pattern of the reticle with exposure light transmitted along an optical axis using a first NA controller that provides a resolution with respect to the direction of the short axis of the mask pattern that is higher than the resolution with respect to the direction of the long axis of the mask pattern,
wherein the first NA controller is moved off of the optical axis after the first exposure process has been performed, and
wherein the second or higher order exposure process comprises positioning a second NA controller along the optical axis and illuminating the mask pattern of the reticle with exposure light transmitted along the an optical axis using a second NA controller that provides a resolution with respect to the direction of the long axis of the mask pattern that is higher than the resolution provided by the first NA controller with respect to the direction of the long axis of the mask pattern;
correlating ratios of exposure latitudes E1/E2 and sizes of patterns that will be formed on the substrate when the exposure latitude of the first exposure process is E1 and the exposure latitude of the second or higher order exposure process is E2; and
establishing parameters of the first and the second or higher order exposure processes based on the correlation such that a pattern of a predetermined size will be formed on the substrate.

2. The method of claim 1, wherein the same reticle is used in the exposure processes.

3. The method of claim 1, wherein the reticle is replaced after the first exposure process with a reticle that is used in the second or higher order exposure process, the mask pattern of the reticles used in the first and second or higher order exposure processes having the same shape.

4. The method of claim 1, wherein the exposure light is emitted from a light emitting system, and the exposure processes each comprise projecting an image of the mask pattern onto the substrate using a projection lens, and further comprising correlating ratios of the NA (numerical aperture) of the light emitting system to the NA (numerical aperture) of the projection lens with sizes of patterns that will be formed on the substrate, and setting the numerical apertures of the light emitting system and the projection lens based on the correlation such that a pattern of a predetermined size will be formed on the substrate.

5. A multiple exposure method comprising:
performing a first exposure process by exposing a region of a resist on a substrate to exposure light directed through a reticle; and
subsequently performing a second or higher order exposure process by exposing said region of the resist to exposure light directed through a reticle,
wherein the reticle used in each of the exposure processes has a mask pattern of features spaced by a first pitch along a short axis, and by a second pitch along a long axis, wherein with the first pitch is shorter than the second pitch, and
wherein the first exposure processes comprises illuminating the mask pattern of the reticle using at the same time a first NA controller that provides a resolution with respect to the direction of the short axis of the mask pattern that is higher than the resolution with respect to the direction of the long axis of the mask pattern, and a second NA controller that provides a resolution with respect to the direction of the long axis of the mask pattern that is higher than the resolution provided by the first NA controller with respect to the direction of the long axis of the mask pattern,
wherein second or higher order exposure process comprises illuminating the mask pattern of the reticle using again at the same time the first NA controller and the second NA controller;
correlating ratios of exposure latitudes E3/E4 and sizes of patterns that will be formed on the substrate when the exposure latitude of the first exposure process is E3 and the exposure latitude of the second or higher order exposure process is E4; and
establishing parameters of the first and the second or higher order exposure processes based on the correlation such that a pattern of a predetermined size will be formed on the substrate.

6. The method of claim 5, wherein the same reticle is used in the exposure processes.

7. The method of claim 5, wherein the reticle is replaced after the first exposure process with a reticle that is used in the second or higher order exposure process, the mask pattern of the reticles used in the first and second or higher order exposure processes having the same shape.

8. The method of claim 5, wherein the exposure light is emitted from a light emitting system, and the exposure processes each comprise projecting an image of the mask pattern onto the substrate using a projection lens, and further comprising correlating ratios of the NA (numerical aperture) of the light emitting system to the NA (numerical aperture) of the projection lens with sizes of patterns that will be formed on the substrate, and setting the numerical apertures of the light emitting system and the projection lens based on the correlation such that a pattern of a predetermined size will be formed on the substrate.

9. A multiple exposure method comprising:
performing a first exposure process by exposing a region of a resist on a substrate to exposure light directed through a reticle; and
subsequently performing a second or higher order exposure process by exposing said region of the resist to exposure light directed through a reticle, wherein the exposure light is emitted from a light emitting system, wherein the reticle used in each of the exposure processes has a mask pattern of features spaced by a first pitch along a short axis, and by a second pitch along a long axis, wherein with the first pitch is shorter than the second pitch, wherein the first and second or higher order exposure processes each comprise projecting an image of the mask pattern of the reticle used in the exposure process onto the substrate using a projection lens, and wherein at least one of the exposure processes comprises illuminating the mask pattern of the reticle using a first NA controller that provides a resolution with respect to the direction of the short axis of the mask pattern that is higher than the resolution with respect to the direction of the long axis of the mask pattern, and wherein at least one of the exposure processes comprises illuminating the mask pattern of the reticle using a second NA controller that provides a resolution with respect to the direction of the long axis of the mask pattern that is higher than the resolution provided by the first NA controller with respect to the direction of the long axis of the mask pattern;

correlating ratios of the NA (numerical aperture) of the light emitting system to the NA (numerical aperture) of the projection lens with sizes of patterns that will be formed on the substrate; and setting the numerical apertures of the light emitting system and the projection lens based on the correlation such that a pattern of a predetermined size will be formed on the substrate.

10. The method of claim 9, wherein the same reticle is used in the exposure processes.

11. The method of claim 9, wherein the reticle is replaced after the first exposure process with a reticle that is used in the second or higher order exposure process, the mask pattern of the reticles used in the first and second or higher order exposure processes having the same shape.

12. A multiple exposure method comprising:

performing a first exposure process by exposing a region of a resist on a substrate to exposure light directed through a first reticle;

replacing the first reticle with a second reticle; and subsequently performing a second or higher order exposure process by exposing said region of the resist to exposure light directed through the second reticle, wherein the mask patterns of the first and second reticles, used in the first and second or higher order exposure processes, respectively, have the same shape made up of features spaced by a first pitch along a short axis, and by a second pitch along a long axis, the first pitch being shorter than the second pitch, and wherein at least one of the exposure processes comprises illuminating the mask pattern of the reticle using a first NA controller that provides a resolution with respect to the direction of the short axis of the mask pattern that is higher than the resolution with respect to the direction of the long axis of the mask pattern, and wherein at least one of the exposure processes comprises illuminating the mask pattern of the reticle using a second NA controller that provides a resolution with respect to the direction of the long axis of the mask pattern that is higher than the resolution provided by the first NA controller with respect to the direction of the long axis of the mask pattern.

* * * * *